(12) United States Patent
Kurihara et al.

(10) Patent No.: US 6,876,792 B2
(45) Date of Patent: Apr. 5, 2005

(54) PHASE MASK FOR FORMING DIFFRACTION GRATING, AND OPTICAL FIBER AND OPTICAL WAVEGUIDE HAVING DIFFRACTION GRATING DUPLICATED USING THE PHASE MASK

(75) Inventors: Masaaki Kurihara, Tokyo (JP); Shigekazu Fujimoto, Tokyo (JP); Tetsuro Komukai, Musashino (JP); Tetsuro Inui, Musashino (JP)

(73) Assignees: Dai Nippon Printing Co., Ltd., Tokyo (JP); Nippon Telegraph and Telephone Corporation, Tokyo (JP)

(*) Notice: Subject to any disclaimer, the term of this patent is extended or adjusted under 35 U.S.C. 154(b) by 0 days.

(21) Appl. No.: 10/421,634

(22) Filed: Apr. 21, 2003

(65) Prior Publication Data

US 2004/0005117 A1 Jan. 8, 2004

(30) Foreign Application Priority Data

Apr. 23, 2002 (JP) ........................................ 2002-120694

(51) Int. Cl.$^7$ .............................. G02B 6/34; G02B 6/00; G02B 5/18
(52) U.S. Cl. ........................ 385/37; 385/122; 359/573; 359/575
(58) Field of Search ............................. 385/10, 37, 39, 385/122; 359/287, 573, 575, 278, 279; 355/53; 430/321

(56) References Cited

U.S. PATENT DOCUMENTS

| | | | | |
|---|---|---|---|---|
| 5,857,043 A | | 1/1999 | Cook ........................... | 385/37 |
| 5,945,261 A | * | 8/1999 | Rourke ........................ | 430/321 |
| 6,214,495 B1 | | 4/2001 | Segawa et al. ................ | 430/5 |
| 2001/0036002 A1 | * | 11/2001 | Tearney et al. ............. | 359/287 |
| 2002/0081069 A1 | * | 6/2002 | Yeniay et al. .................. | 385/39 |
| 2002/0102055 A1 | * | 8/2002 | Zweiback et al. ............. | 385/37 |
| 2002/0122626 A1 | * | 9/2002 | Rothenberg et al. .......... | 385/37 |
| 2002/0180941 A1 | * | 12/2002 | Hansen ......................... | 355/53 |
| 2003/0006212 A1 | | 1/2003 | Segawa et al. ................ | 216/12 |

FOREIGN PATENT DOCUMENTS

GB       2389669 A  * 12/2003  ............. G03F/1/16

OTHER PUBLICATIONS

Apodised in–fibre Bragg grating reflectors photoimprinted using a phase mask, B. Malo, S. Theriault, D,C. Johnson, F. Bilodeau, J. Albert and K.O. Hill, Electronics Letters, 2nd Feb. 1995, vol. 31, No. 3, P223–225.

Malo et al, "Apodised in–fibre Bragg grating reflectors photoimprinted using a phase mask", Electronics Letters, vol. 31, No. 3, Feb. 1995, pp. 223–225.

* cited by examiner

*Primary Examiner*—Frank G. Font
*Assistant Examiner*—Mary El-Shammaa
(74) *Attorney, Agent, or Firm*—Dellett & Walters

(57) ABSTRACT

The present invention relates to a precision phase mask for forming diffraction grating in optical fiber and optical waveguide, to provide them with nonlinear chirped grating for dispersion compensation use and having low fluctuation or crosstalk in the group delay characteristics. The diffraction grating is formed by means of interference fringe between diffracted lights of different orders, in which the cycle of the diffraction grating 20 increases nonlinearly, wherein plurality of diffraction gratings $G_1$, $G_2$, $G_3$ . . . having different cycles are assembled on a plane in increasing order of the cycle with the directions of the diffraction gratings directed to the same direction, and assembled in such a manner that, where the cycle of grating changes nonlinearly and discontinuously, the regions having larger rate of change of the cycle contain proportionally more discontinuous phases per unit length.

19 Claims, 3 Drawing Sheets

PHASE MASK FOR FORMING DIFFRACTION GRATING, AND OPTICAL FIBER AND OPTICAL WAVEGUIDE HAVING DIFFRACTION GRATING DUPLICATED USING THE PHASE MASK

BACKGROUND OF THE INVENTION

The present invention relates to a phase mask for forming diffraction grating, and to an optical fiber and an optical waveguide having Bragg diffraction grating fabricated using the phase mask. The invention especially relates to a fabrication method of a phase mask for forming diffraction grating in optical waveguide and optical fiber used in the optical communication and other uses, by means of ultraviolet light, and to an optical waveguide and an optical fiber having Bragg diffraction grating fabricated using the phase mask.

In optical fiber communication system, it is necessary to transmit a large volume of information at very high speed. An optical fiber system comprises an optical signal source for carrying information, an optical fiber transmission line, and a receiver for demodulating information carried by optical signals.

In optical fiber communication system, a silica optical fiber with high purity is generally used as transmission medium. Conventionally, optical communication systems have been designed to use a certain wavelength range for transmitting optical signals. In such systems, transmission delay occurs depending on wavelength. In the past, however, this dispersion did not significantly deteriorate the information of optical signals. This is because in the early systems, a single channel was used which was selected from a wavelength range having small dispersion.

In these days, however, it is required to use a number of channels ranging in a wide wavelength region in order to carry more information, as is the case in wavelength division multiplexing (WDM) system, which is one of the high speed transmission techniques using optical fiber. This in turn requires a more precise compensation of the group velocity dispersion. For instance, in relation to WDM system, the dispersion compensation has become an increasingly important problem as the number of channels provided in WDM system increases.

Further, as the Bragg diffraction grating formed within optical fiber, a chirped grating has come to be required recently, in which the grating pitch increases or decreases linearly or nonlinearly depending on the position of the grating in a direction perpendicular to the grating pitch (the direction along which the grating is repeated) These gratings are used in such uses as high reflection mirror with enlarged reflection band and delay adjusting means.

Corresponding to above described increasing requirement to the chirped grating, the inventor of the present invention has proposed a method for fabricating phase mask for processing optical fiber. According to this method, a transparent substrate comprises on its one surface a repetitive pattern of grooves and strips located in a grating form, so that an optical fiber is irradiated with diffracted light according to the repetitive pattern so as to make a diffraction grating within the optical fiber by an interference fringe of diffracted lights of different orders, wherein a plurality of patterns comprising differently pitched grooves and strips are imaged in a juxtaposed relation, thereby fabricating the repetitive pattern of grooves and strips located in a grating form (Japanese Unexamined Patent Publication No. H11-72631).

In conventional fabrication method of the mask for forming nonlinear chirped grating used for the purpose of dispersion compensation, the rate of change of the cycle on the mask varies depending on section. In this case, in such region with a large variation in the rate of change of the cycle depending on section, deterioration of performance such as increase of ripple (fluctuation) in the group delay characteristics may be caused.

SUMMARY OF THE INVENTION

The present invention is made in view of the above described problems, and it is the object of the invention to provide a precision phase mask for forming diffraction grating in optical fiber and optical waveguide, especially a nonlinear chirped grating for dispersion compensation with small ripple (fluctuation) or crosstalk in the group delay characteristics.

In order to achieve the above described object, a phase mask for forming diffraction grating of the present invention is a phase mask for forming diffraction grating by means of interference fringe between diffracted lights of different orders, in which the cycle of diffraction grating increases nonlinearly, and is characterized in that a plurality of diffraction gratings having different cycles are assembled on a plane in increasing order of the cycle with the directions of the gratings directed to the same direction.

Another phase mask for forming diffraction grating of the present invention is a phase mask for forming diffraction grating by means of interference fringe between diffracted lights of different orders, in which the cycle of diffraction grating changes discontinuously, and is characterized in that a plurality of diffraction gratings having different cycles are assembled on a plane with the directions of the gratings directed to the same direction.

In these masks, where the cycle of diffraction grating changes nonlinearly and discontinuously, the diffraction gratings are preferably assembled in such a manner that the regions having larger rate of change of the cycle contain proportionally more discontinuous phases of the cycle per unit length.

In addition, these phase masks for forming diffraction grating are preferably formed by imaging with an electron beam imaging device or a laser imaging device.

The present invention includes an optical fiber and an optical waveguide in which diffraction grating is formed using the phase mask for forming diffraction grating, by means of interference fringe between diffracted lights of different orders diffracted from the mask, and thus formed diffraction grating may have the purpose of, for instance, dispersion compensation, in which the noise (fluctuation, ripple) in the group delay characteristics may be ±10 ps or lower.

A Phase mask for forming diffraction grating and an optical fiber and an optical waveguide provided with diffraction grating duplicated using this mask according to the present invention have a plurality of diffraction gratings with different cycles which are assembled on a plane in increasing order of the cycle with the directions of the gratings directed to the same direction, or are assembled on a plane with the directions of the gratings directed to the same direction, and especially in such a manner that those regions having larger rate of change of the cycle contain proportionally more discontinuous phases of the cycle per unit length. In this manner, a phase mask for fabricating a high performance chirped grating can be easily produced without increasing the imaging time. In addition, using this phase mask, an optical fiber and an optical waveguide with high performance chirped Bragg diffraction grating can be easily fabricated.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

DESCRIPTION OF THE PREFERRED EMBODIMENTS

Hereinafter, the basic principle and examples of the present invention will be described.

Figure 1:
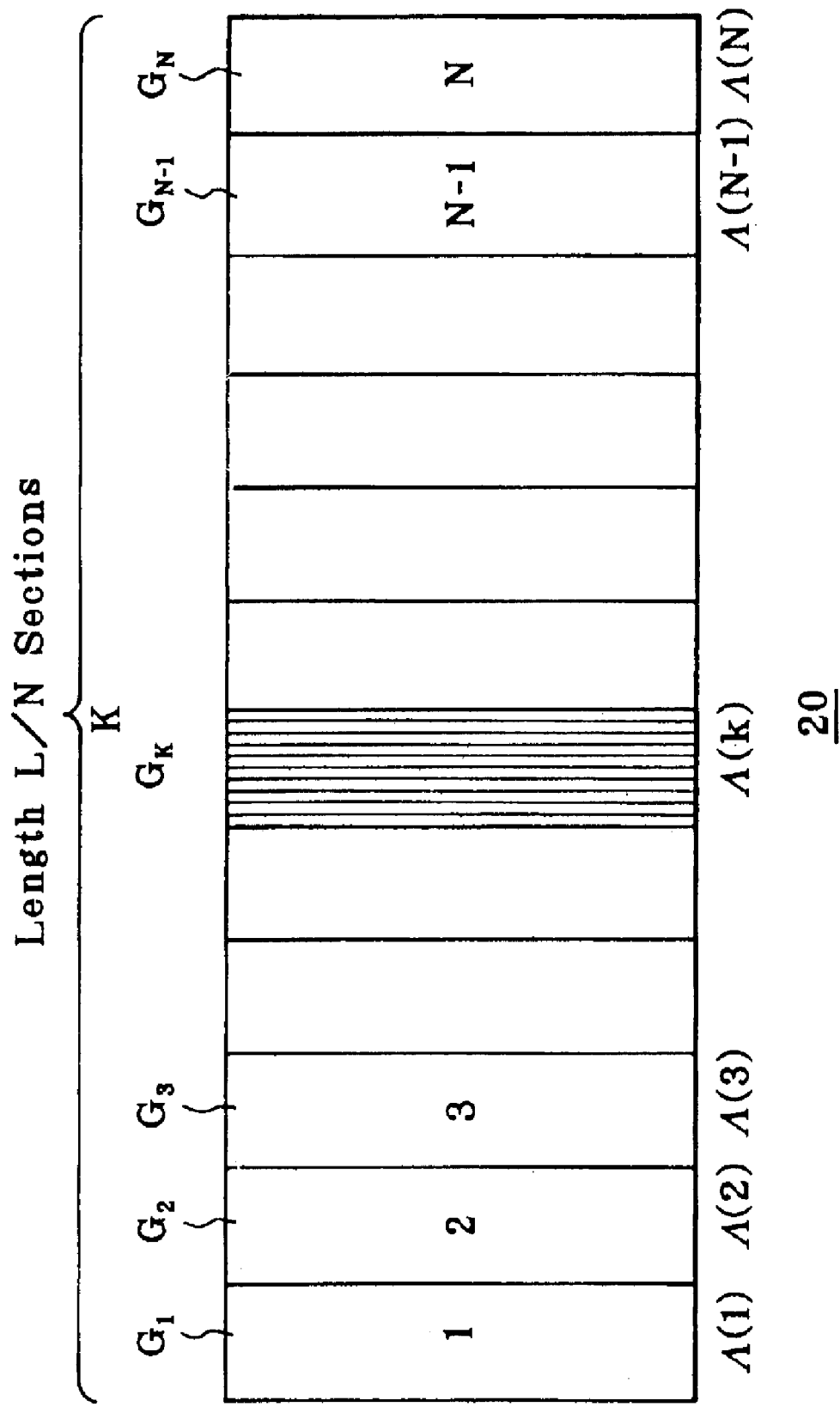
FIG. 1 is an illustration for explaining the principle and construction of a phase mask for forming diffraction grating according to the present invention.

A chirped grating 20 in a phase mask for forming diffraction grating is expressed, as shown schematically in FIG. 1, as an assembly in which gratings $G_1$, $G_2$, $G_3$, ... $G_k$ ... $G_{N-1}$, $G_N$ with different cycles $\Lambda(k)$ are arranged on a plane in such a manner that they have the same direction of gratings. Such chirp is called a step chirp.

When the grating is divided into N sections, the cycle $\Lambda$ of the k-th grating $G_k$ is expressed by:

$$\Lambda(k) = \Lambda_0 + \Delta\Lambda f(k) \qquad (1)$$

In this equation, $\Lambda_0$ is the cycle of the first grating $G_1$, $\Delta\Lambda$ is a factor determining the rate of change of the cycle, and f(k) is an arbitrary coefficient determining the change of the cycle.

When f(k) is a linear function, the rate of change of the cycle is constant in any section. On the other hand, when f(k) is a nonlinear function, it varies depending on section. In the latter case, a large variation in the rate of change of the cycle depending on section leads to deterioration of performance such as increase of ripple in the group delay characteristics.

Therefore, the present invention is directed to a method of decreasing the variation of the rate of change of the cycle. Specifically, in the present invention, the number of sections N of the chirped grating 20 is varied corresponding to the rate of change of the cycle. That is, the number of sections is increased in a region where the rate of change of the cycle is large, while the number of sections is decreased in a region where the rate of change of the cycle is small. In this manner, a phase mask can be fabricated without increasing the imaging time, while the performance of a chirped grating fabricated using the mask is improved.

Such phase mask 20 for forming diffraction grating can be fabricated by an electron beam imaging device or a laser imaging device, similarly to the conventional technique.

Further, a duplication product of this phase mask can be used for the purpose of dispersion compensation, in which the group delay characteristics can be improved to ±10 ps or lower.

Based on the principle of the present invention, various nonlinear chirped fiber gratings can be fabricated. However, from the viewpoint of high order dispersion compensation in optical fiber, two kinds of nonlinear chirped grating A, B are important and useful as well, of which Bragg wavelength distributions are expressed by the following equations, respectively (T. Komukai et al, "The design of dispersion equalizers using chirped fiber Bragg gratings", IEEE J. Quantum electron, vol. 36, no. 4, pp. 409–417, 2000).

In the description hereinafter, a phase mask for fabricating chirped fiber grating will be referred to as chirped mask.

Here, it is assumed that the position coordinate for the shortest wavelength point of a chirped fiber grating is z=0, and that the longest wavelength point is $z=L_g$. In addition, $\Delta\lambda$ indicates a band for the chirped fiber grating.

$$\lambda_A(z) = \lambda_{A0} + \Delta\lambda (z/L_g)^{1/2} \qquad (2)$$

$$\lambda_B(z) = \lambda_{B0} + \Delta\lambda\{1-(1-z/L_g)^{1/2}\} \qquad (3)$$

The pitches of the nonlinear step chirped masks A, B for fabricating these gratings are expressed by:

$$\lambda_A(k) = \lambda_{A0} + \Delta\Lambda (k/N)^{1/2} \qquad (4)$$

$$\lambda_B(k) = \lambda_{B0} + \Delta\Lambda\{131\ (1-k/N)^{1/2}\} \qquad (5)$$

where N indicates the number of sections into which the patterns of nonlinear step chirped masks A, B are equally divided. A certain value is necessary for N. Symbol k indicates the ordinal of patterns (counted from shorter pitch pattern).

Meanwhile, in the case of a linear chirped fiber grating, the distribution of Bragg wavelength and the pitch of linear step chirped mask used in the fabrication are expressed by:

$$\lambda_{FG}(z) = \lambda_s + \Delta\lambda\ (z/L_g) \qquad (6)$$

$$\Lambda_{FG}(k) = \Lambda_0 + \Lambda\ (k/N) \qquad (7)$$

In the case of a linear pattern, the pitch difference $\Delta\Lambda(m)$ between m-th section and (m+1)-th section is expressed by:

$$\Delta\Lambda_{FG}(m) = \Lambda_{FG}(m+1) - \Lambda_{FG}(m) = \Lambda/N \qquad (8)$$

indicating that it is constant anywhere. In the case of the nonlinear chirped mask A, it is expressed by:

$$\Delta\Lambda_A(m) = \Lambda_A(m+1) - \Lambda_A(m) = \Delta\Lambda[\{(m+1)/N\}^{1/2} - (m/N)^{1/2}] \qquad (9)$$

Accordingly, $$\Delta\Lambda_A(1) = \Lambda_A(2) - \Lambda_A(1) = \Delta\Lambda\{(\sqrt{2}-1)/\sqrt{N}\} \qquad (10)$$

$$\Delta\Lambda_A(N-1) = \Lambda_A(N) - \Lambda_A(N-1) = \Delta\Lambda[1-\{(N-1)/N\}^{1/2}] \qquad (11)$$

It can be seen that, the nearer the k is to 1, the larger the pitch difference is, and the nearer the k is to N, the smaller the pitch difference is.

On the contrary, in the case of mask B, the nearer the k is to 1, the smaller the pitch difference is, and the nearer the k is to N, the larger the pitch difference is.

It will be understood that regions with large discontinuity exists in a nonlinear chirped pattern. When these regions are transferred as it is to a chirped fiber grating, a group delay ripple arises. On the contrary, in those regions with very small pitch difference between adjacent sections, imaging error of imaging device tends to occur, which likewise leads to deterioration of the group delay characteristics in fabricated chirped grating.

Therefore, by giving more number of sections per unit length to regions with large pitch change and giving less number of sections per unit length to regions with small pitch change, N can be smaller and unnecessary characteristics deterioration can be avoided.

According to R. Kashyarp, in the case of a linear chirped grating, the least necessary number $N_{min}$ of sections can be expressed as follows (R. Kashyarp, "Design of step-chirped fiber Bragg gratings", Opt. Commun., vol. 136, pp. 461–469, 1997).

$$N_{min}=\alpha\Delta\lambda L_g \quad (12)$$

where $\alpha=5.5\times10^{11}$ $(m^{-2})$

From this equation, the least necessary number of sections is given by;

$$n=N_{min}/L_g=\alpha\Delta\lambda \quad (13)$$

As nonlinear chirped grating can be approximately regarded as a linear chirped grating when viewed partly, the equation (13) is regarded to be applicable to a short region.

That is, when an nonlinear chirped gratings is divided into sufficiently short regions along the longitudinal direction, the equation (13) can be applied to each divided grating. However, the band is different for each divided grating, because the rate of change m(z) of Bragg wavelength is not constant. Here, the rate of change m(z) means:

$$m(z)=d\lambda/dz \quad (14)$$

In the case of linear chirped grating, the following equation is obtained as a differential of the equation (6):

$$m_{FG}(z)=\Delta\lambda/L_g=N_{min}/\alpha L_g^2=n/\alpha L_g \quad (15)$$

Hence:

$$n=\alpha L_g\, m_{FG} \quad (16)$$

Meanwhile, in the case of nonlinear chirped grating A:

$$m_A(z)=\Delta\lambda/2\sqrt{(L_g z)} \quad (17)$$

For a sufficiently short region, in analogy to the equation (16), the least necessary number of sections $n_A$ (z) per unit is thought to be given by:

$$n_A(z)=\alpha L_g m_A(z)=\tfrac{1}{2}\times\alpha\Delta\lambda\sqrt{(L_g/z)} \quad (18)$$

Likewise, in the case of the nonlinear chirped grating B, the following equations are obtained:

$$m_B(z)=\Delta\lambda/\{2L_g\sqrt{(1-z/L_g)}\} \quad (19)$$

$$n_B(z)=\alpha L_g m_B=\alpha\Delta\lambda/\{2\sqrt{(1-z/L_g)}\} \quad (20)$$

Thus, the phase mask patterns which realize nonlinear chirped fiber gratings A, B exhibit the pitch change expressed in equations (4), (5), while fulfilling equations (18), (20) within sufficiently small regions. In this case, N value in equations (4), (5) can be replaced with the product of $N_A$ (z) for respective region and the length $L_g$. The sufficiently small region means ideally a section so small that nonlinear chirp can be regarded as approximately linear, but practically, dividing the whole length into 3 regions may be sufficient. When a pattern is divided into X regions, the designed number of sections per unit length $N_d$ (z) has to fulfill the following conditions at arbitrary point z within respective regions:

$$N_d(z)\geq N_A(z)=\tfrac{1}{2}\times\alpha\Delta\lambda\sqrt{(L_g/z)} \quad (21)$$

$$N_d(z)\geq N_B(z)=\alpha\Delta\lambda\{2\sqrt{(1-z/L_g)}\} \quad (22)$$

However, in the case of the chirped grating A, in the region which include Z=0, the above equation has only to be fulfilled at a point where z=δ, assuming that δ is a certain positive value which is sufficiently small. Likewise, in the case of the chirped grating B, in the region including $z=L_g$, the above equation has only to be fulfilled at a point where $z=L_g-\delta$, assuming that δ is a certain positive value which is sufficiently small.

Hereinafter, the method according to the present invention for fabricating a phase mask used in processing optical fiber will be described based on an example.

FIGS. 2(a)–2(h) are sectional views showing steps of a fabricating method according to the present invention in reference to an example. In FIGS. 2(a)–2(h), reference numeral 10 designates a phase mask blank, 11 designates a quartz substrate, 12 designates a chromium thin film, 12A designates a chromium thin film pattern, 12B designates a chromium thin film opening, 13 designates a resist, 13A is a resist pattern, 13B designates a resist opening, 14 designates electron beam, 15 designates a groove, and 17 designates a phase mask.

Figure 2A:
FIGS. 2(a)–2(h) are sectional views showing steps of a fabricating method of a phase mask for processing optical fiber according to the present invention in reference to an example.

First, a blank 10 was prepared which comprises a quartz substrate 11 and a chromium thin film 12 with a thickness of 150 μm formed on the quartz substrate by sputtering (FIG. 2(a)).

Chromium thin film 12 helps to prevent charge up in subsequent process where resist is irradiated with electron beam, and serves as a mask when grooves 15 are formed on the quartz substrate 11.

Figure 2B:
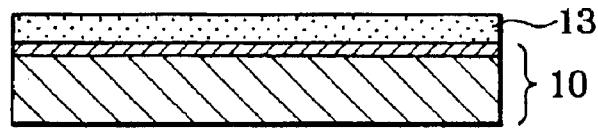

As a resist 13, an electron beam resist RE5100P (available from Hitachi Chemical Co., Ltd.) was used and applied in 400 nm thickness followed by drying (FIG. 2(b)). Then, a pattern of chirped grating 20 (FIG. 1) was imaged on the resist 13 with electron beam 14, in which the pattern was divided according to the method of the present invention as described in the following.

Here, an example of a nonlinear chirped fiber grating B will be described. The band Δλ and the longest wavelength point $L_g$ of the chirped fiber grating were: Δλ=5.5 nm, and $L_g$=10 mm, respectively. When z is expressed in [mm]:

$$n_B(z)=5.5/\{2\sqrt{(1-z/10)}\}\ [1/mm] \quad (23)$$

The larger the z is, the larger the number of sections per unit length should be, because as z nears to 10 mm, $n_B$ (z) nears to ∞.

When the pattern is divided into three regions, the division will be for example: 0≤z≤5 mm (region I), 5≤z≤7.5 mm (region II), and 7.5≤z≤10 mm (region III). The number of sections per unit length in the region I is: $n_d(z)\geq n_B$ (z=5 mm) 3.9/mm. Hence, the necessary total number of sections in the region I will be 3.9×5=19.5 or larger, that is, 20 or larger.

Likewise, the number of sections for the region II is 14 or larger (in this case z=7.5 mm is substituted for the right side of the equation (21)), and the number of sections for the region III is 31 or larger (in this case z=9.5 mm is substituted for the right side of the equation (21)).

A margin of three times was given so that 60 sections for the region I, 40 sections for the region II, and 100 sections for the region III were employed. Here, the equations of pitches for each region are given by substituting N of the equation (5) with 60×10 mm/5 mm=120, 40×10 mm/2.5 mm=160, and 100×10 mm/2.5 mm=400, respectively. The corresponding k are 1–60 (the region I), 81–120 (the region II), and 301–400 (the region III), respectively.

Figure 2C:
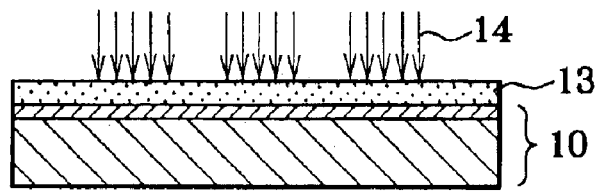

After that, the resist 13 was exposed in a chirped grating pattern using an electron beam imaging device MEBE S (available from ETEC Co.) at an exposure value of 1.2 $\mu C/cm^2$ (FIG. 2(c)).

Figure 2D:
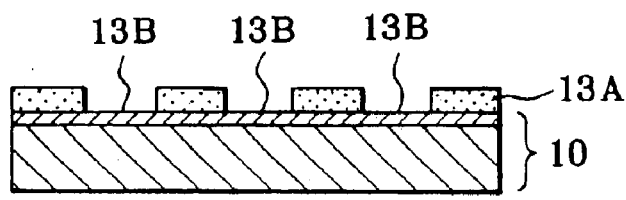
Figure 2E:
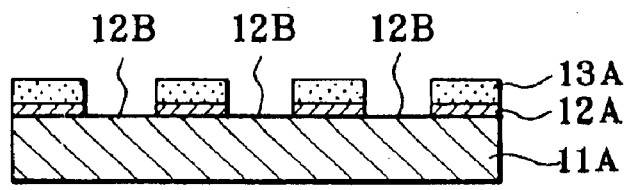

Then, using obtained resist pattern 13A (FIG. 2(d)) as mask, the chromium thin film was dry-etched with $Cl_2$ gas to form a chromium thin film pattern 12A (FIG. 2(e)).

Figure 2F:
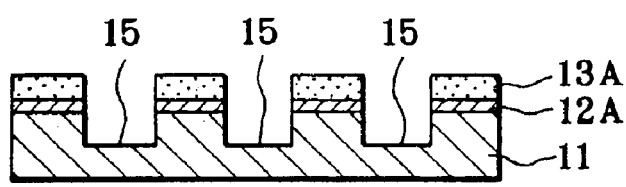

Then, using the chromium thin film pattern 12A as mask, the quartz substrate 11 was etched with $CF_4$ gas to a depth of 240 nm (FIG. 2(f)). The control of etching depth was performed by controlling the etching time, in which manner the etching depth could be controlled in a range of 200–400 nm.

Figure 2G:
Figure 2H:
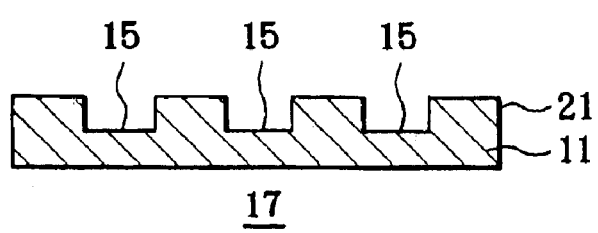

After that, the resist pattern 13A was peeled with sulfuric acid (FIG. 2(g)) of 70° C., and the chromium thin film pattern 12A was removed by etching with ammonium cerium nitrate solution followed by washing, to complete a phase mask 17 comprising grooves 15 having a length of 110 mm, a depth of 240 nm, and a pitch of 1.070 $\mu m$ in central value (FIG. 2(h)).

An optical fiber provided for fabricating fiber grating using above described phase mask 17 was designed to decrease the radiation mode loss which is a problem in forming chirped grating (L. Dong et al., "Optical fibers with depressed claddings for suppression of coupling into cladding modes in fiber Bragg gratings" IEEE Photo. Tech. Lett., vol. 9, pp. 64–66, 1997) and was sensitized to a high sensitivity by high pressure hydrogen loading (P. J. Lemaire, et al., "High pressure $H_2$ loading as a technique for achieving ultrahigh UV photosensitivity and thermal sensitivity in $GeO_2$ doped optical fibers", Electron, Lett., vol. 29, no. 13, pp. 1191–1193, 1993). The core of the optical fiber was irradiated via fabricated nonlinear step chirped phase mask 17 with an ultraviolet laser light (wavelength 244 nm), so that diffracted light of +1 order and diffracted light of −1 order interfered within the core of the optical fiber, thereby fabricating a nonlinear chirped grating having a length of 10 mm (This fabrication (duplication) method is shown in a conventional technique described in Japanese unexamined patent publication No. H11-72631). During this, an apodization was applied in order to suppress the group delay ripple due to reflection between both ends of the grating (B. Malo et. al., "Apodised in fiber Bragg grating reflectors photoimprinted using a phase mask", Electron, Lett., vol. 31, no. 3, pp. 223–225, 1995).

Figure 3:
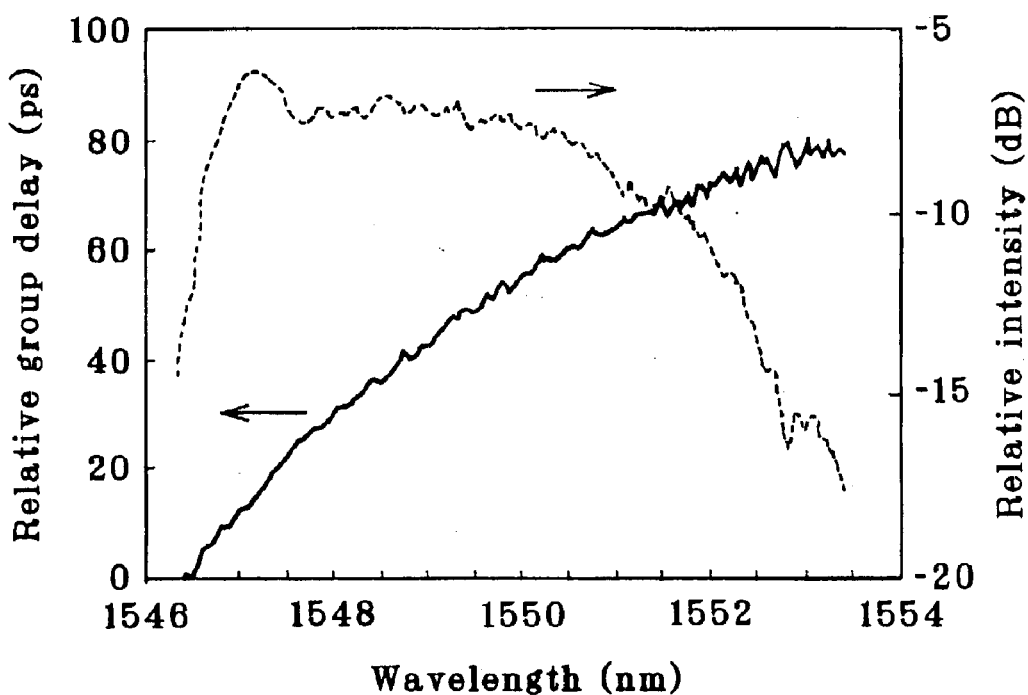
FIG. 3 is a graph showing the group delay characteristics and the relative intensity of a nonlinear chirped fiber grating fabricated using a nonlinear step chirped mask of an embodiment of the present invention.
Figure 4:
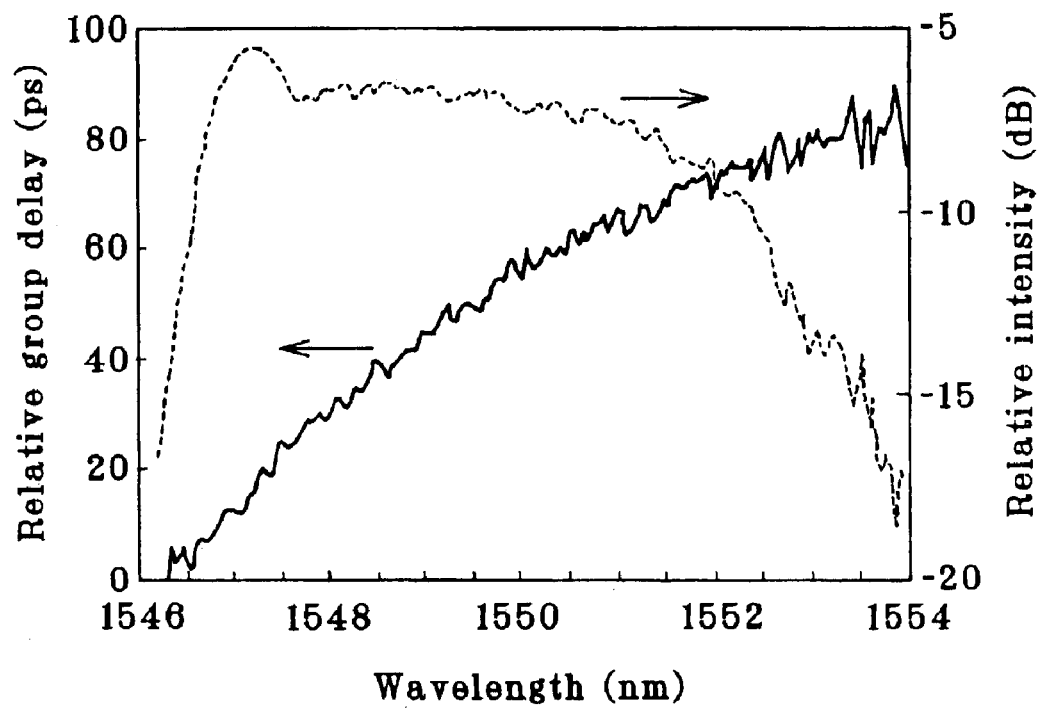
FIG. 4 is a graph showing the group delay characteristics and the relative intensity of nonlinear chirped fiber grating fabricated using a nonlinear step chirped mask of a comparative example.

FIG. 3 is a graph showing the group delay characteristics and the relative intensity of a nonlinear chirped fiber grating fabricated using nonlinear step chirped mask B in which number of sections is increased in regions having a large rate of change of the cycle and number of sections is decreased in regions having a small rate of change of the cycle, according to the aforementioned example. FIG. 4 is a graph similar to FIG. 3, but showing a comparative example of a nonlinear chirped fiber grating fabricated using a nonlinear step chirped mask having a constant section density along the longitudinal direction. As clearly shown in FIG. 4, the grating fabricated using the nonlinear step chirped mask with constant section density along the longitudinal direction has a very large group delay ripple. This is because it uses a nonlinear step chirped mask having a pitch obtained by using simply N=200 in the equation (5).

In contrast, as clearly shown in FIG. 3, a nonlinear chirped fiber grating fabricated using a nonlinear chirped mask B having section density which varies along the longitudinal direction has a substantially small group delay ripple.

In this manner, the present invention makes it possible to obtain a dispersion compensation device (optical fiber with Bragg diffraction grating or optical waveguide with Bragg diffraction grating) in which the noise (fluctuation, ripple) in the group delay characteristics is suppressed to ±10 ps or lower.

Though the phase mask for forming diffraction grating and the optical fiber or optical waveguide duplicated using the phase mask of the present invention have been described based on the principle and the example, the present invention is not limited to this example and various modifications may be made.

As is clear from the above description, the present invention provides a phase mask for forming diffraction grating, and an optical fiber and an optical waveguide having a diffraction grating duplicated using the mask, in which a plurality of diffraction gratings with different cycles are assembled on a plane in increasing order of the cycle with the direction of the gratings directed to the same direction, or are assembled on a plane with the direction of the gratings directed to the same direction, and especially assembled in such a manner that the regions having larger rate of change of the cycle contain proportionally more discontinuous phases of the cycle per unit length. This allows a phase mask for forming high performance chirped grating to be fabricated easily without increasing the imaging time, and allows an optical fiber and an optical waveguide with high performance chirped Bragg diffraction grating to be easily fabricated using the phase mask.

What is claimed is:

1. A phase mask for forming diffraction grating by means of interference fringe between diffracted lights of different orders, in which the period of diffraction grating increases nonlinearly, wherein a plurality of diffraction gratings having different periods are assembled on a plane in increasing order of the period with the directions of the gratings directed to the same direction, wherein where the period of grating changes nonlinearly and discontinuously, the regions having larger rate of change of the period contain proportionally more discontinuous phases of the period per unit length.

2. A phase mask for forming diffraction grating by means of interference fringe between diffracted lights of different orders, in which the period of diffraction grating changes discontinuously, wherein a plurality of diffraction gratings having different periods are assembled on a plane with the directions of the gratings directed to the same direction, wherein where the period of grating changes nonlinearly and discontinuously, the regions having larger rate of change of the period contain proportionally more discontinuous phases of the period per unit length.

3. A phase mask as claimed in claim 1 or 2, wherein the diffraction gratings are formed by imaging with an electron beam imaging device or a laser imaging device.

4. An optical fiber, wherein a diffraction grating is formed using the phase mask as claimed in claim 1 or 2 by means of interference fringe between diffracted lights of different orders from said phase mask.

5. An optical fiber as claimed in claim 4, wherein the formed diffraction grating has the purpose of dispersion compensation.

6. An optical fiber as claimed in claim 5, wherein the noise (fluctuation or ripple) in the group delay characteristics is ±10 ps or lower.

7. An optical waveguide, wherein a diffraction grating is formed using the phase mask as claimed in claim 1 or 2 by means of interference fringe between diffracted lights of different orders from said phase mask.

8. An optical waveguide as claimed in claim 7, wherein the formed diffraction grating has the purpose of dispersion compensation.

9. An optical waveguide as claimed in claim 8, wherein the noise (fluctuation or ripple) in the group delay characteristics is ±10 ps or lower.

10. An optical fiber, wherein a diffraction grating is formed using the phase mask as claimed in claim 3 by means of interference fringe between diffracted lights of different orders from said phase mask.

11. An optical fiber as claimed in claim 10, wherein the formed diffraction grating has the purpose of dispersion compensation.

12. An optical fiber as claimed in claim 11, wherein the noise (fluctuation or ripple) in the group delay characteristics is ±10 ps or lower.

13. An optical waveguide, wherein a diffraction, grating is formed using the phase mask as claimed in claim 4 by means of interference fringe between diffracted lights of different orders from said phase mask.

14. An optical waveguide as claimed in claim 13, wherein the formed diffraction grating has the purpose of dispersion compensation.

15. An optical waveguide as claimed in claim 14, wherein the noise (fluctuation or ripple) in the group delay characteristics is ±10 ps or lower.

16. A phase mask as claimed in claim 1, wherein the number of sections $n_A(z)$ per unit is defined by the equation:

$$n_A(z) = \alpha L_g m_A(z) = \tfrac{1}{2} \times \alpha \Delta \lambda \sqrt{(L_g/z)}.$$

17. A phase mask as claimed in claim 2, wherein the number of sections $n_A(z)$ per unit is defined by the equation:

$$n_A(z) = \alpha L_g m_A(z) = \tfrac{1}{2} \times \alpha \Delta \lambda \sqrt{(L_g/z)}.$$

18. A phase mask as claimed in claim 1, wherein the number of sections $n_B(z)$ per unit is defined by the equation:

$$n_B(z) = \alpha L_g m_B(z) = \alpha \Delta \lambda \sqrt{} / \{2\sqrt{(1-z/L_g)}\}.$$

19. A phase mask as claimed in claim 2, wherein the number of sections $n_B(z)$ per unit is defined by the equation:

$$n_B(z) = \alpha L_g m_B(z) = \alpha \Delta \lambda \sqrt{} / \{2\sqrt{(1-z/L_g)}\}.$$

* * * * *